(12) United States Patent
Oshio

(10) Patent No.: US 6,510,013 B1
(45) Date of Patent: Jan. 21, 2003

(54) PHASE-SYNCHRONIZATION METHOD AND CIRCUIT FOR ESTABLISHING A PHASE-SYNCHRONIZATION FOR SIGNALS WITH REDUCED TIME

(75) Inventor: Umeo Oshio, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/563,414

(22) Filed: May 3, 2000

(30) Foreign Application Priority Data

Sep. 3, 1999 (JP) .......................................... 11-250800

(51) Int. Cl.[7] ................................................. G11B 5/09
(52) U.S. Cl. ........................ 360/32; 360/51; 341/111; 375/371; 331/18
(58) Field of Search ..................... 360/51, 32; 341/111, 341/112, 115, 116; 375/371, 373, 375, 376; 331/18

(56) References Cited

U.S. PATENT DOCUMENTS 5,528,198 A * 6/1996 Baba et al. .................... 331/14

* cited by examiner

Primary Examiner—Alan T. Faber
(74) Attorney, Agent, or Firm—Arent Fox Kintner Plotkin and Kahn

(57) ABSTRACT

A phase-synchronizing circuit includes a phase error detection circuit detecting a phase-error in a given clock signal and producing an output indicative of the phase-error as a first phase-error signal, a phase-error creating circuit creating a second phase-error signal determined so as to minimize a time for establishing a phase-synchronization for the clock signal, and a selection circuit selectively supplying the first or second phase-error signal selectively to a phase control circuit.

7 Claims, 9 Drawing Sheets

FIG.1 RELATED ART
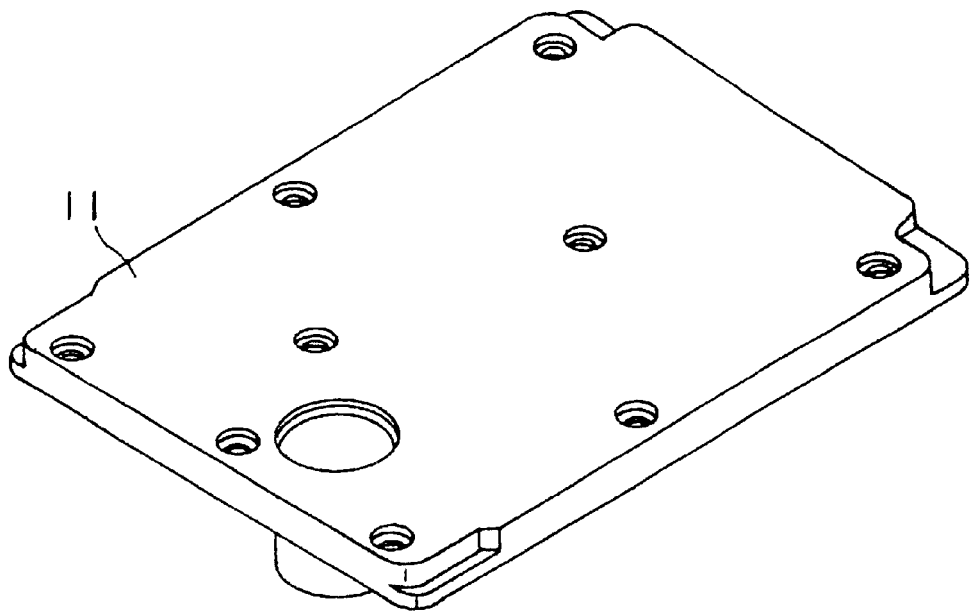
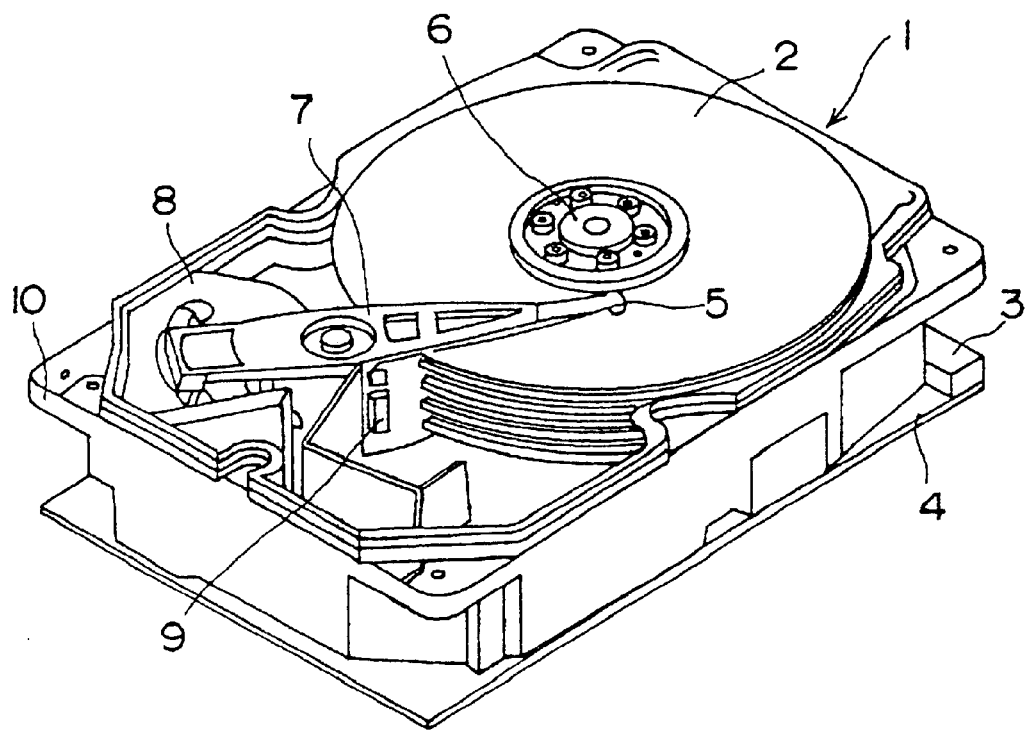

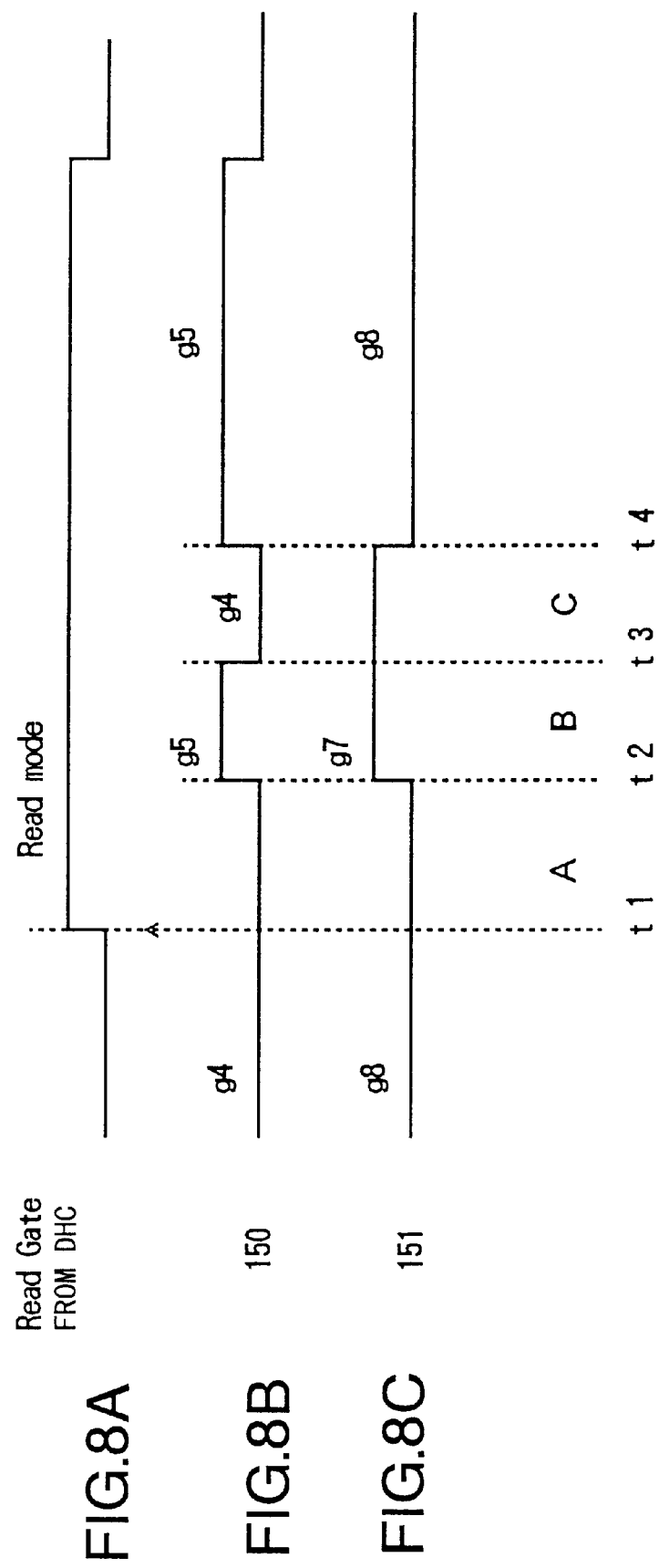

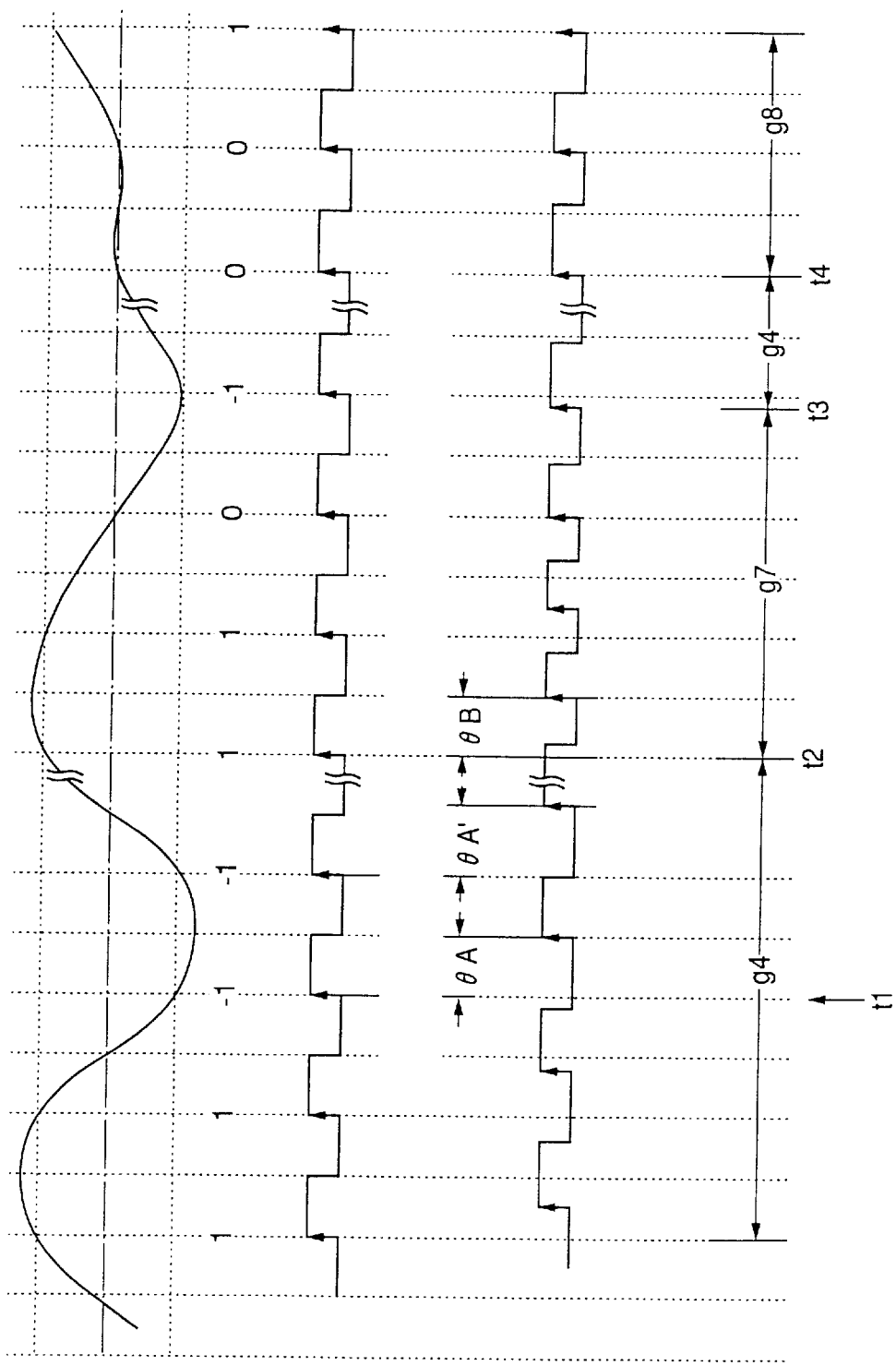

PHASE-SYNCHRONIZATION METHOD AND CIRCUIT FOR ESTABLISHING A PHASE-SYNCHRONIZATION FOR SIGNALS WITH REDUCED TIME

BACKGROUND OF THE INVENTION

The present invention generally relates to the art of phase-synchronization of signals and more particularly to a phase-synchronizing circuit and method for use in various electronic apparatuses including magnetic disk device.

Particularly, the present invention relates to a phase-synchronizing circuit and method in which the time needed for establishing a phase synchronization is minimized.

FIG. 1 shows an example of a magnetic disk device 1 according to a related art.

Referring to FIG. 1, the magnetic disk drive 1 includes a magnetic disk 2 accommodated in an enclosure 10 having a cover 11 and stores information on the magnetic disk 2 in the form of concentric tracks. The magnetic disk 2 is mounted on a spindle motor 6 for rotation, and a floating magnetic head 5 scans over the surface of the magnetic disk 5. The magnetic head 5 is mounted at an end of a swing arm 7, wherein the arm 7 is connected to a voice coil motor 8 and the voice coil motor 8 actuates the arm 7 for swinging motion. With the swinging motion of the arm 7 thus caused by the voice coil motor 8, the magnetic head 5 scans over the surface of the magnetic disk 2 generally in a radial direction thereof. Thereby, the magnetic head 5 is controlled so as to trace a desired track on the disk 2.

The voice coil motor 8 is supplied with an electric signal from a read/write amplifier 9 for actuating the arm 7, while the read/write amplifier 9 further supplies an electric signal to the magnetic head 5 via the arm 7 for writing or reading of information on or from the magnetic disk 2. Thus, in response to the electric signal, the magnetic head 5 senses, or alternatively induces, a magnetization on the magnetic disk 2 and writing or reading of information is achieved on or from the magnetic disk 2.

It should be noted that the electric signal thus supplied to the magnetic head 5 from the read/write amplifier 9 corresponds to the data created and supplied from a host device (not shown), wherein the host device supplies the data to a circuit substrate 4 of the magnetic disk device 1 via a connector 3, and the electric circuit provided on the circuit substrate 4 converts the data to the electric signal.

In the construction of FIG. 1, it should be noted that the magnetic disk 2, the magnetic head 5, the spindle motor 6, the arm 7, the voice coil motor 8 and the read/write amplifier 9 are accommodated in the enclosure 10 having the cover 11.

In an example in which an operation is made in the host device for reproducing the information from the magnetic disk 2, the data indicative of the operation is supplied to the circuit substrate 4 via the connector 3, and the circuit substrate 4 converts the data to corresponding signals for activating the various parts of the magnetic disk device 1 including the magnetic head 5.

In response to the electric signal thus supplied, the magnetic head 5 reads the information stored on the magnetic disk 2. The information thus read out by the magnetic head 5, in turn, is forwarded to the read/write amplifier 9 for amplification and further to the processing circuit provided on the circuit substrate 4 for conversion to digital data indicative of the result of the reading operation. The data thus produced by processing circuit on the circuit substrate 4 is then forwarded to the host device not illustrated via the connector 3.

Next, a description will be made on the signal processing carried out by the processing circuit on the circuit substrate 4.

FIG. 2 shows the construction of the magnetic disk device of FIG. 1 in the form of a block diagram.

Referring to FIG. 2, the signal processing circuit on the circuit substrate 4 includes an interface (I/F) 400, a hard disk controller (HDC) unit 401, a read gate 402, an AGC (automatic gain controller) unit 403, a modulator unit 407, a write driver unit 408, a gain error detection unit 409, and a sampling clock generator 410, wherein the interface 400 converts the data supplied from the host device into corresponding signals which the electric circuits on the circuit board 4 of FIG. 2 can handle.

In the construction of FIG. 2, it should be noted that the HDC unit 401 supplies the signals thus produced to corresponding circuits constituting the processing circuit on the circuit board 4.

More specifically, in the case of operating the magnetic disk device 1 in a recording (writing) mode, the HDC unit 401 supplies the signals to the modulator 407 for modulation. In response to this, the modulator 407 produces a modulated output signal and supplies the same to the write driver unit 408 for write control operation. Thereby, desired information is written on the magnetic disk 2 by way of the magnetic head 5, after being subjected to an encoding process conducted in the read/write amplifier 9.

In the case of a reproducing (reading) mode, the HDC 401 unit activates the sampling clock generator 410, the AGC unit 403 and the read/write amplifier 9 by sending thereto the electric signals.

In response to the activation, the read/write amplifier 9 reads the information recorded on the magnetic disk 2 via the magnetic head 5 and produces a decoded signal. The AGC unit 403 is supplied with the decoded signal and supplies the same to the sampling clock generator 410 for processing after automatic gain control. After the processing in the sampling clock generator 410, the information signal is supplied to the HDC unit 401 and the HDC unit 401 supplies the processed information signal to the host device via the interface 400 and the connector 3.

Hereinafter, the operation of the sampling clock generator 410 of FIG. 2 will be explained in detail.

As indicated in FIG. 2, the sampling clock generator 410 includes an ADC (analog-to-digital converter) unit 404, a demodulator 405 and a phase-synchronizing circuit 406, wherein the ADC unit 404, the demodulator 405 and the phase-synchronizing circuit 406 constitutes a phase-locked loop.

When writing or reading information to or from the magnetic disk 2, the magnetic head 5 is first caused to scan over a specific track of the magnetic disk 2 carrying a synchronization pattern, and the information signal indicative of the synchronization pattern is picked up. After processing in the read/write amplifier 9 and the ACG unit 403, the ADC unit 404 of the sampling clock generator 410 converts the synchronizing signal into a corresponding digital signal by sampling the synchronizing signal according to a clock signal supplied from the phase-synchronizing circuit 406.

The digital signal thus produced is supplied to the demodulator 405, wherein the demodulator 405 has a synchronizing signal pattern corresponding to the synchronization pattern on the magnetic disk 2 and produces a phase-error signal indicative of the phase-error of the digital signal, and hence the phase-error of the clock signal used in the ADC unit 404, based on the comparison of the output of the ADC unit 404 with the synchronizing signal pattern held therein.

The output of the demodulator 405 indicative of the phase-error thus produced is then supplied to the phase-synchronizing circuit 406 and the phase-synchronizing circuit 406 adjusts the timing or phase of the phase synchronizing signal such that the detected phase-error is nullified.

After a synchronization is thus established for the clock signal produced by the phase-synchronizing circuit 406, the magnetic head 5 is caused to scan over the track from which an information signal is to be read out or over the track on which an information signal is to be written, and the information signal thus read out from the magnetic disk 2 is sampled, after being processed by the read/write amplifier 9 and the AGC unit 403, in the ADC unit 404 by the clock signal produced by the phase-synchronizing circuit 406 with the desired phase synchronization. The demodulator 405 thereby demodulates the output of the ADC unit 404 and supplies the same to the HDC unit 401.

FIG. 3 shows the construction of the phase-synchronizing circuit 406 according to a related art.

Referring to FIG. 3, the phase-error signal is supplied from the demodulator 405 to a phase-error detection circuit 13 constituting a part of the phase-synchronizing circuit 406, wherein the phase-synchronizing circuit 406 includes a switch 14 and a VCO (voltage controlled oscillator) 12 and the switch 14 forwards, under control of the read gate unit 402, the output of the phase-error detection circuit 13 indicative of the phase-error detected by the demodulator 405 to the VCO 12 during the phase synchronizing mode of the magnetic disk device 1. In response to the signal supplied from the phase-error detection unit 13, the VCO 12 changes the oscillation frequency thereof, and hence the phase of the clock signal supplied to the ADC unit 404.

More specifically, during the phase synchronizing mode of the magnetic disk device 1 in which the magnetic head 5 scans over the synchronizing pattern on the magnetic disk 2, the switch 14 is controlled by the read gate unit 402 such that a movable contact $f_3$ of the switch 14 makes a contact with a fixed contact $f_2$ to which the output of the phase-error detection circuit 13 is supplied, while the read gate unit 402 controls the switch 14, when the phase synchronization is accomplished, or before the phase synchronization mode is commenced, such that the movable contact $f_3$ makes a contact with another fixed contact $f_1$ to which a zero voltage is supplied.

Thus, during the phase synchronizing mode of the magnetic disk device 1, the VCO 12 is controlled in response to the output of the phase-error detection circuit 13 such that the phase-error detected in the phase-error-detection circuit 13 becomes zero. Thus, by repeating the loop operation of FIG. 3, the phase-error of the clock signal in the ADC unit 404 is gradually decreased.

FIG. 4A shows the waveform of the synchronizing signal pattern held in the demodulator 405, while FIG. 4B shows the waveform of the clock signal having a timing ideally synchronized with the synchronizing signal pattern of FIG. 4A. Further, FIG. 4C shows the timing of the clock signal actually produced by the phase-synchronizing circuit 406.

As represented in FIG. 4C, the clock signal of the phase-synchronizing circuit 406 has a phase-error at an initial interval designated by "$f_1$" in which the movable contact $f_3$ is connected to the fixed contact $f_1$. On the other hand, the phase-error is gradually decreased by the action of the foregoing PLL circuit in the sampling clock generator 410 during the next interval designated in FIG. 4D as "$f_2$." During the second interval designated as $f_2$, it should be noted that the movable contact $f_3$ is connected to the fixed contact $f_2$. It should be noted that the second interval corresponds to the phase synchronization mode or phase-locked mode.

Once the desired phase synchronization is achieved, the movable contact $f_3$ in the switch 14 may be switched back to the fixed contact $f_1$ and the oscillation frequency of the VCO 12 is fixed. Thereby, the VCO produces the synchronized clock signal to the ADC unit 404.

On the other hand, the construction of the related art represented in FIG. 3 has a problem in that it takes a fairly long time until the clock signal of FIG. 4C achieves a phase synchronization to form the synchronized clock signal such as the one shown in FIG. 4B. Until the desired phase synchronization is established, it is necessary to conduct the feedback process for a prolonged duration. Due to the fact that a long time is needed for achieving the phase synchronization, the phase of the clock signal, which is subjected to the process of phase synchronization, tends to be adversely changed by external noise, and the like. Thereby, the duration needed for achieving the phase synchronization is increased further.

SUMMARY OF THE INVENTION

Accordingly, it is a general object of the present invention to provide a novel and useful magnetic disk device and a PLL circuit for use in such a magnetic disk device wherein the foregoing problems are eliminated.

Another and specific object of the present invention is to provide a magnetic disk device having a reduced access time.

Another object of the present invention is to provide a phase-synchronizing circuit and method wherein a phase synchronization is achieved for a clock signal with a reduced time.

Another object of the present invention is to provide a phase-synchronizing circuit, comprising:

a clock generator generating a clock signal;

a phase-error detection circuit detecting a first phase-error of said clock signal based on an output signal formed in response to said clock signal;

a phase control circuit controlling the phase of said clock signal in response to a phase-error supplied thereto;

a phase-error value creation circuit creating a second phase-error value, said second phase-error value being determined so as to minimize a time needed for establishing a phase synchronization of said clock signal; and a selection circuit selectively supplying one of said first phase-error value and said second phase-error value to said phase control circuit as an output signal representing said phase-error, said phase control circuit thereby adjusting a phase of said clock signal in response to said output signal of said selection circuit.

Another object of the present invention is to provide a phase synchronizing method of a clock signal, comprising the steps of:

detecting a first phase-error value indicative of a phase-error of a clock signal based on an output signal formed in response to said clock signal;

creating a second phase-error value so as to minimize a time needed for establishing a phase synchronization of said clock signal based on said first phase-error value;

selecting one of said first and second phase-error values as a selected phase-error value; and adjusting a phase of said clock signal in response to said selected phase-error value.

Another object of the present invention is to provide a storage device, comprising:

a storage medium storing information on a recording surface thereof;

a read/write head scanning over said recording surface of said storage medium;

a signal processing circuit connected to said read/write head for processing an analog output signal of said read/write head, said signal processing circuit comprising:

a clock generator generating a clock signal;

a phase-error detection circuit detecting a first phase-error of said clock signal based on an output signal formed in response to said clock signal;

a phase control circuit controlling the phase of said clock signal in response to a phase-error supplied thereto;

a phase-error value creation circuit creating a second phase-error value, said second phase-error value being determined so as to minimize a time needed for establishing a phase synchronization of said clock signal; and a selection circuit selectively supplying one of said first phase-error value and said second phase-error value to said phase control circuit as an output signal representing said phase-error, said phase control circuit thereby adjusting a phase of said clock signal in response to said output signal of said selection circuit According to the present invention, the time needed for establishing a synchronization of the clock signal is reduced substantially by replacing the phase-error value to a specific value chosen for minimizing the time needed for phase synchronization at the beginning of the phase-synchronizing process. Once the phase-error is thus eliminated or reduced, the phase-synchronizing process is switched to an ordinary phase-synchronizing process that uses an observed phase-error value for phase-error nullification or compensation of the clock signal.

Other objects and further features of the present invention will become apparent from the following detailed description when read in conjunction with the attached drawings.

BRIEF DESCRIPTION OF THE DRAWINGS

FIG. 1 is a diagram showing the overall construction of a magnetic disk drive according to a related art;

FIGS. 8A–8C are diagrams showing a timing of switching an operational mode according to the present invention; and FIGS. 9A–9D are diagrams showing the phase synchronization achieved by the present invention.

DETAILED DESCRIPTION OF THE INVENTION

Figure 5:
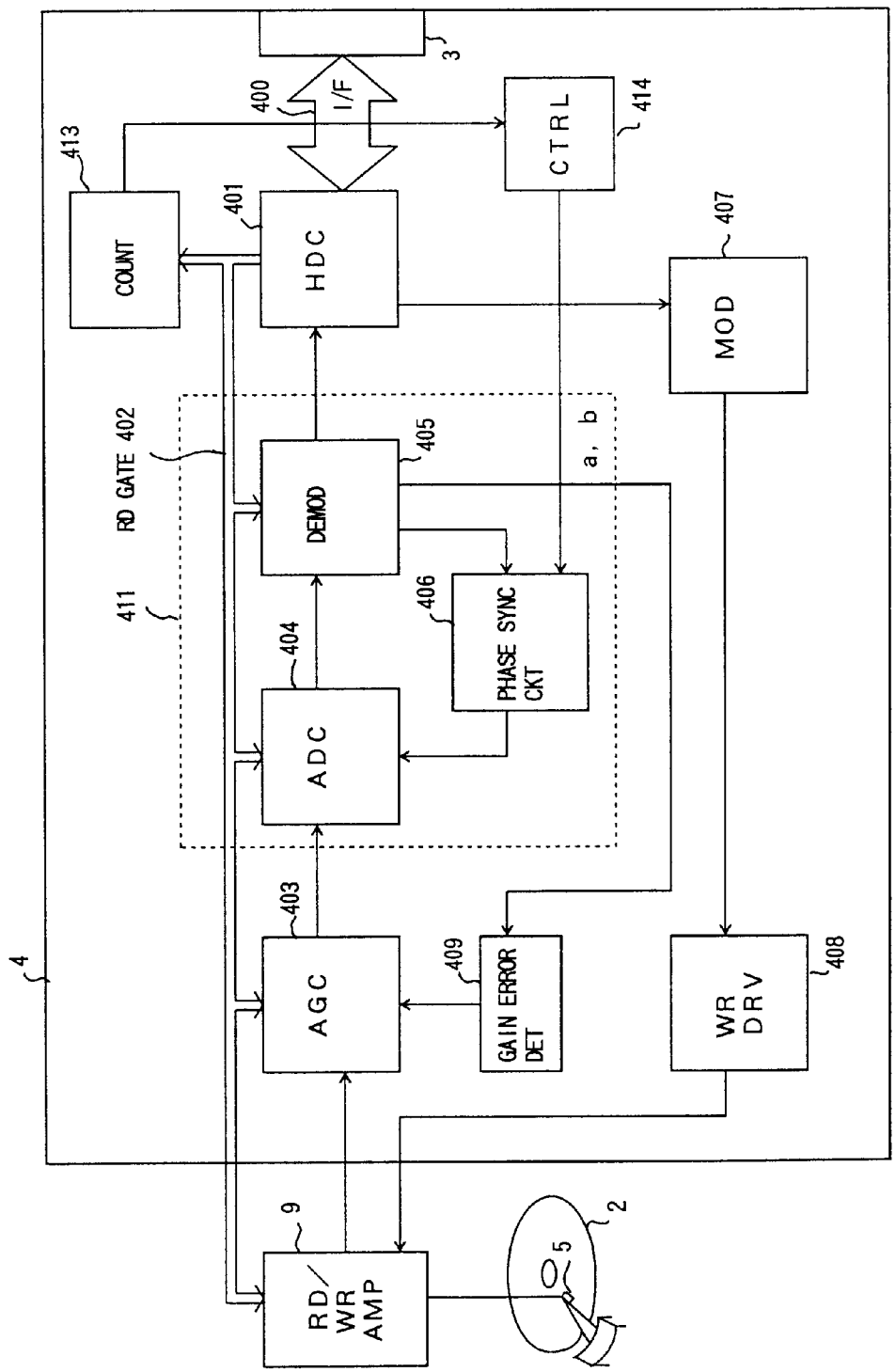
FIG. 5 is a block diagram showing the construction of a signal processing system according to a first embodiment of the present invention.

FIG. 5 shows the block diagram of a signal processing system used in a magnetic disk device according to an embodiment of the present invention. It should be noted that the magnetic disk device of the present embodiment has a mechanical construction similar to that of the magnetic disk device 1 described previously with reference to FIG. 1 and the description thereof will be omitted. In FIG. 5, those parts corresponding to the parts described already are designated by the same reference numerals and the description thereof will be omitted.

Figure 2:
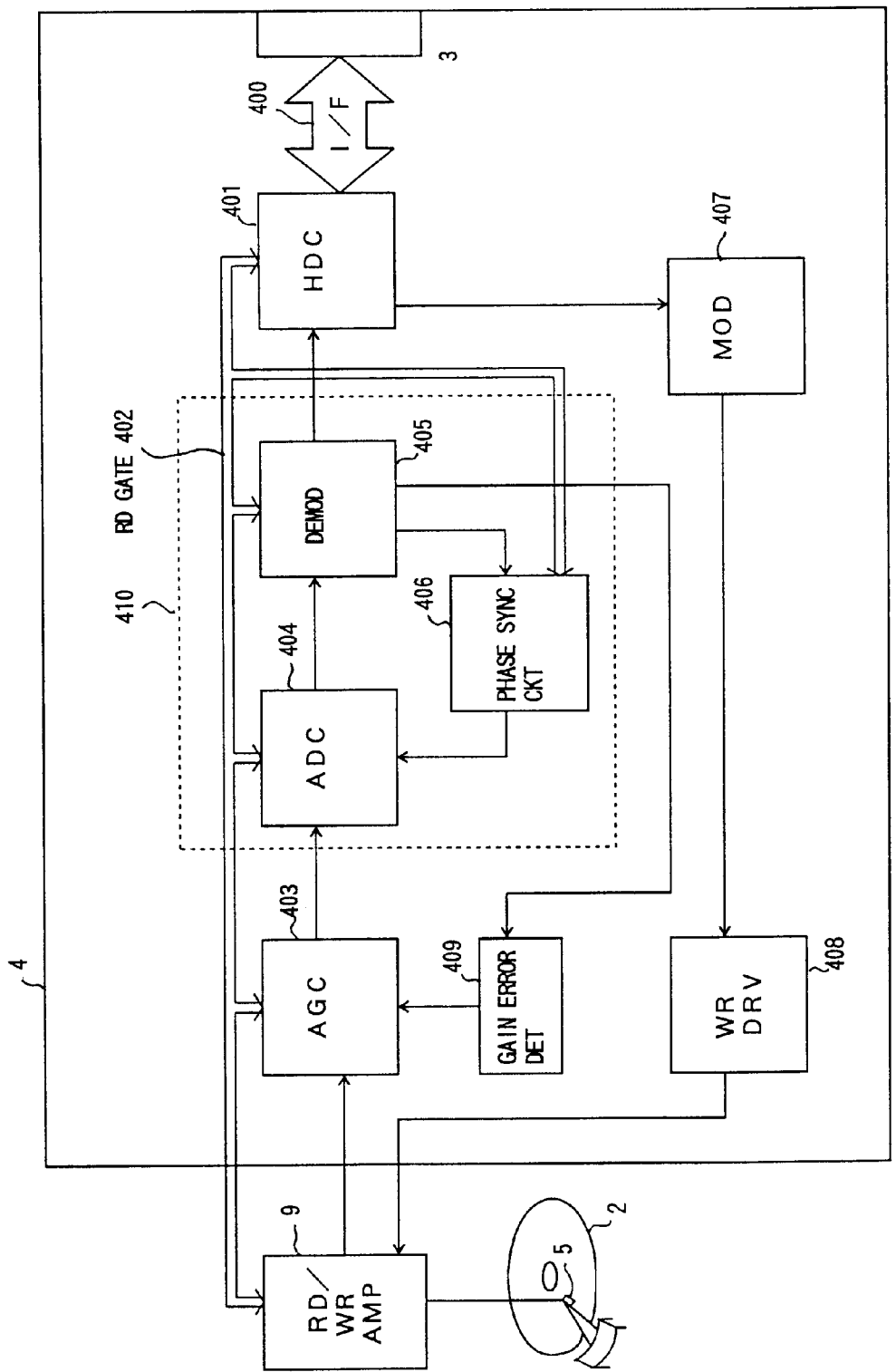
FIG. 2 is a block diagram showing the construction of a signal processing system used in the magnetic disk drive of FIG. 1.

Referring to FIG. 5, the circuit substrate 40 of the magnetic disk device now includes, in addition to the interface 400, the HDC unit 401, the read gate 402, the AGC unit 403, the modulator 407, the write driver 408, the gain error detection unit 409, a sampling clock generator 411, a counter 413 and a controller 414, wherein the sampling clock generator 411 has a construction similar to the sampling clock generator 410 of FIG. 2 except that the phase-synchronizing circuit 406 of FIG. 2 is now replaced with a phase-synchronizing circuit 412. Thus, the ADC unit 404, the demodulator 405 and the phase-synchronizing circuit 412 form together a PLL circuit in the sampling clock generator 411.

Thus, in the sampling clock generator 411, the analog signal supplied to the ADC unit 404 from the ACG unit 403 is subjected to an analog-to-digital conversion process by carrying out a sampling in response to the clock signal supplied from the phase-synchronizing circuit 412. The digital signal thus produced is supplied to the demodulator 405 for phase-error detection similarly to the construction of FIG. 2.

The output of the demodulator 405 indicative of the phase-error of the clock signal used in the ADC unit 404 is then fed back to the phase-synchronizing circuit 412 for phase-synchronization of the clock signal used in the ADC unit 404.

In the present embodiment, the phase-error value detected by the demodulator 405 is processed by the phase-synchronizing circuit 412 under control of the controller 414 which in turn refers to the counter 413 that counts the number of the clock pulses during the read interval of the read gate 402. In the present invention, the desired phase synchronization of the clock signal is established substantially instantaneously.

Hereinafter, description will be given for the sampling clock generator 411 used in the present embodiment with reference to FIG. 6.

Figure 6:
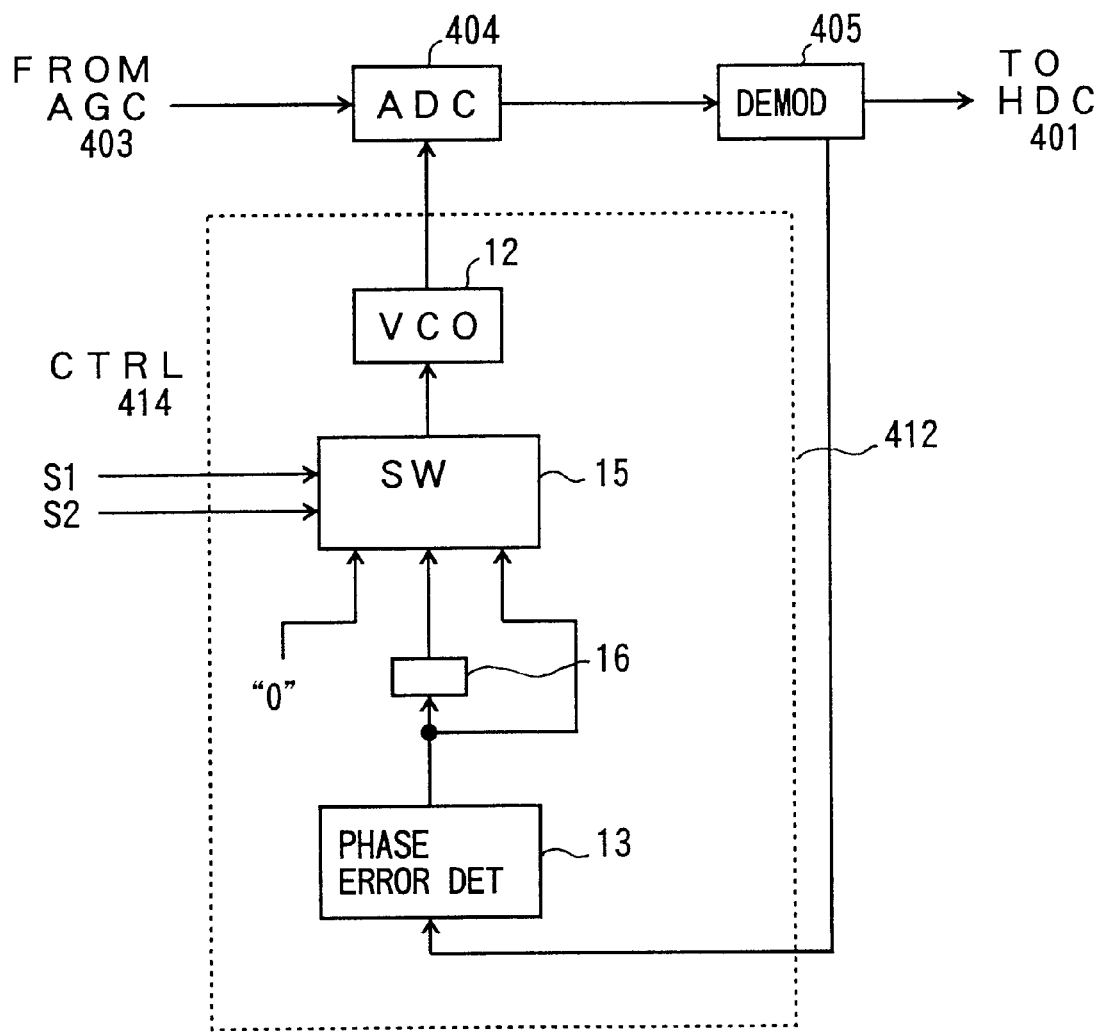
FIG. 6 is a diagram showing the construction of a sampling clock generating part including a phase-synchronizing circuit forming a part of the system of FIG. 5.

Referring to FIG. 6, the sampling clock generator 411 is a loop circuit and includes the ADC unit 404, the demodulator 405 and the phase-synchronizing circuit 412 similarly to the construction of the related art, wherein the phase-synchronizing circuit 412 is formed of the phase error detection unit 13, the VCO 12, and a switch 15 which replaces the switch 14 of the related art. In the present embodiment, it should be noted that the phase-synchronizing circuit 412 further includes an operational unit 16.

Figure 3:
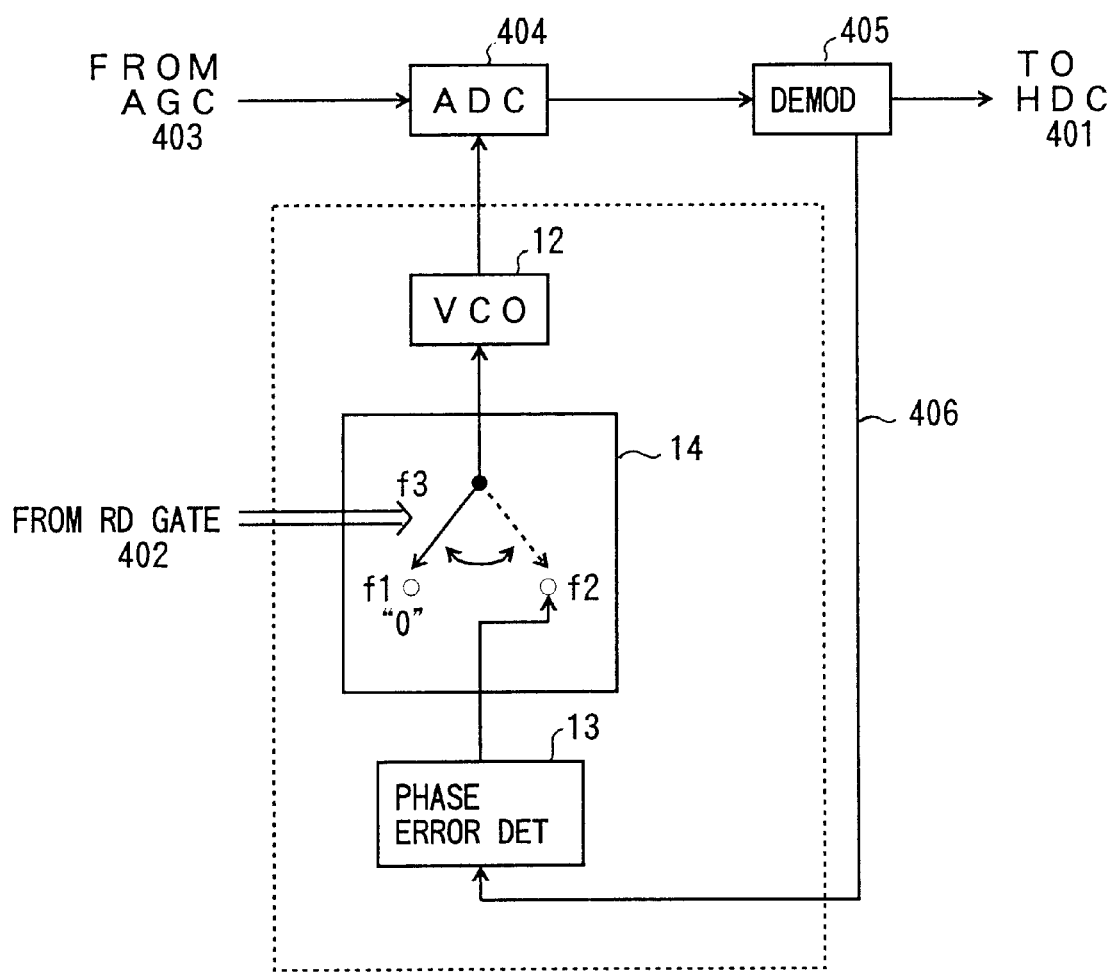
FIG. 3 is a block diagram showing the construction of a sampling clock generating part forming a part of the system of FIG. 2.
Figure 4:
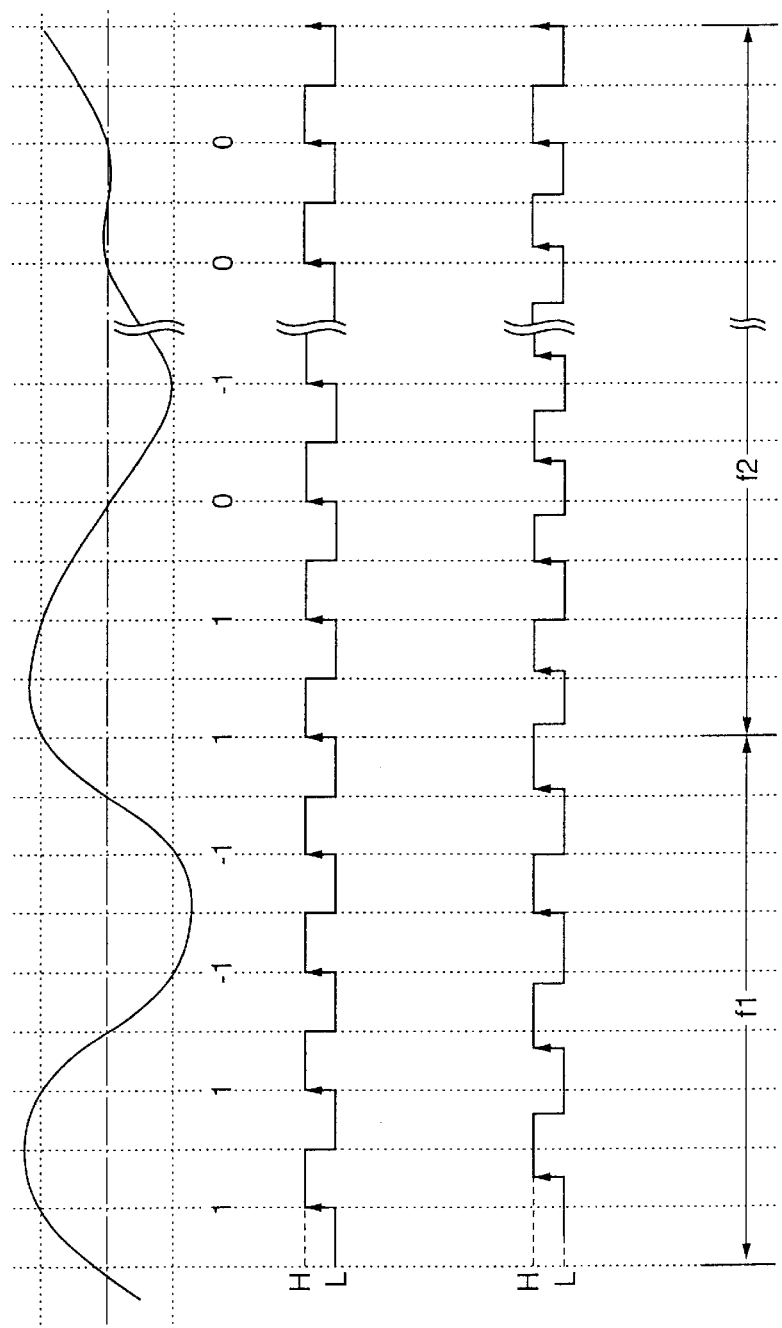
FIGS. 4A–4D are diagrams showing a timing of a phase synchronizing process conducted by the circuit of FIG. 3.

Referring to FIG. 6, the analog signal supplied to the ADC unit 404 is sampled by the clock signal from the VCO 12 and the analog signal thus supplied is converted into a digital signal similarly to the case of the circuit of FIG. 3. The digital signal indicative of the synchronizing signal pattern is then supplied to the demodulator 405, wherein the demodulator 405 detects a phase-error of the digital signal, and hence the phase-error of the clock signal produced by the VCO 12 by conducting a comparison process with the synchronizing signal pattern held in the demodulator 405.

In the present embodiment, the phase error thus obtained is forwarded to the VCO 12 via the switch 15, wherein the switch 15 is under control of the control unit 414 by way of control signal $S_1$ or $S_2$.

Figure 7:
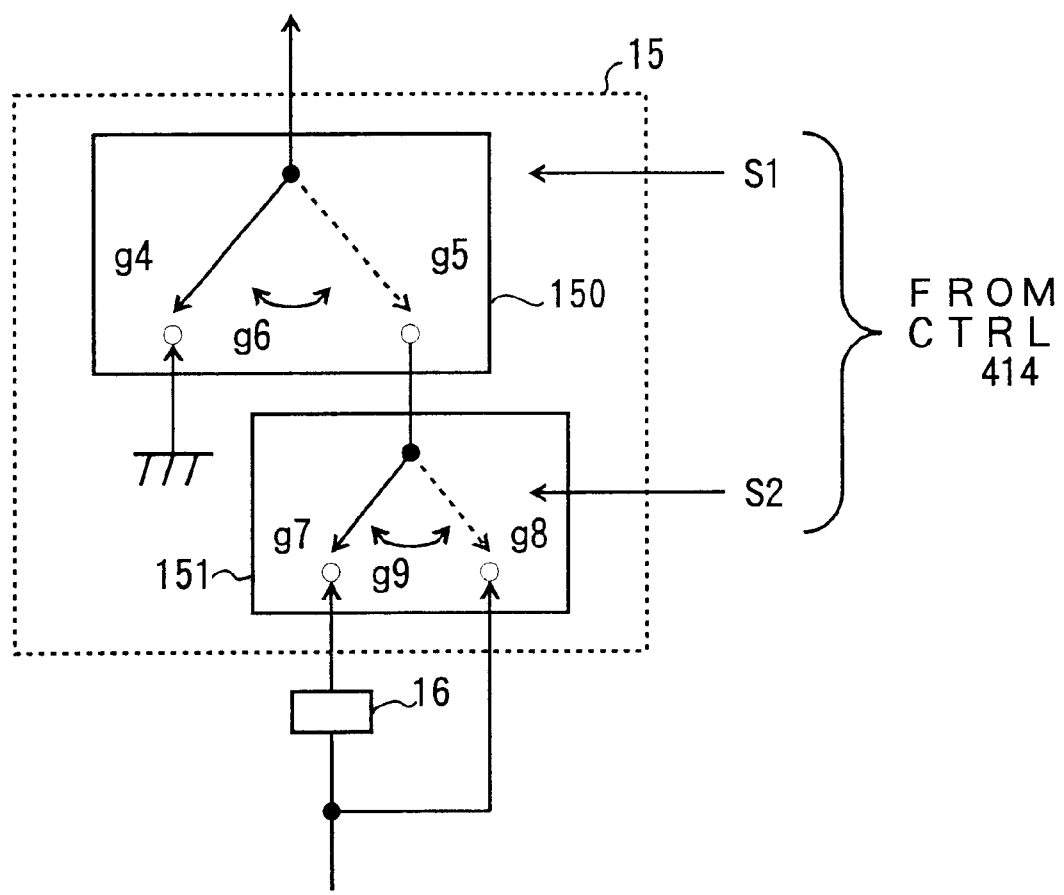
FIG. 7 is a diagram showing the construction of a switch used in the circuit of FIG. 6.

FIG. 7 shows the construction of the switch 15 in more detail.

Referring to FIG. 7, the switch 15 includes two switch units 151 and 152 connected in series such that an output of the switch unit 151 is supplied to a fixed contact $g_5$ of the switch 150, wherein the switch 150 has a movable contact $g_6$ and an additional fixed contact $g_4$ connected to the ground. The movable contact $g_6$ is switched between the fixed contacts $g_4$ and $g_5$ under control of the control signal $S_1$. The switch 150 supplies the signal on the movable contact $g_6$ to the VCO 12.

The switch 151, in turn, includes two fixed contacts $g_7$ and $g_8$ and a movable contact $g_9$, wherein the movable contact $g_9$ is connected to the fixed contact $g_5$ of the switch 150. The movable contact $g_9$ is switched between the fixed contact $g_7$ and the fixed contact $g_8$ under control of the control signal $S_1$. As indicated in FIG. 7, the fixed contact $g_8$ is supplied with the output of the phase-error detection circuit 13 directly, while the fixed contact $g_7$ is supplied with the output of the phase-error detection circuit 13 via the operational unit 16. It should be noted that the operational unit 16 produces a phase-error value $\theta_{Am}$, which is predicted to be formed after m cycles of the synchronizing signal pattern, wherein the phase-error value $\theta_{Am}$ is given according to the relationship $$\theta_{Am} = \theta_A + m \times (\theta_A' - \theta_A) \quad (1)$$

In Eq.(1), it should be noted that $\theta_A$ represents the phase-error at the initial cycle while $\theta_A'$ represents the phase-error for the next cycle.

Thus, in the circuit of FIG. 7, a value "0" indicative of "phase-error=0" is supplied to the VCO 12 when the control signal $S_1$ selects the contact $g_4$, while the phase-error obtained in the demodulator 405 is supplied to the VCO 12 when the control signal $S_1$ selects the fixed contact $g_5$ and the control signal $S_2$ selects the fixed contact $g_8$ simultaneously. When the control signal $S_2$ selects the fixed contact $g_7$ under the state that the control signal $S_1$ selects the fixed contact $g_5$, on the other hand, the phase-error value of Eq.(1) is supplied to the VCO 12 from the operational unit 16.

Using the relationship of Eq.(1), the adjustment of the clock signal for eliminating the phase-error is achieved substantially instantaneously in the present invention.

FIGS. 8A–8C show the timing of controlling the switch 15 conducted by the control circuit 414.

Referring to FIG. 8A showing a control signal supplied from the HDC unit 401 to the read gate 402, the read gate 402 is activated with a timing $t_1$ and the operational mode of the magnetic disk device 1 undergoes a transition to a "Read Mode."

FIGS. 8B and 8C, on the other hand, show the state of the switch units 150 and 151 respectively, wherein FIG. 8B indicates that the movable contact $g_6$ of the switch unit 150 is connected to the fixed contact $g_4$ during the interval designated as $g_4$, while the movable contact $g_6$ is connected to the fixed contact $g_5$ during the interval designated as $g_5$. Similarly, FIG. 8C indicates that the movable contact $g_9$ of the switch unit 151 is connected to the fixed contact $g_8$ during the interval designated as $g_8$, while the movable contact $g_9$ is connected to the fixed contact $g_7$ during the interval designated as $g_7$.

As can be seen from FIGS. 8A–8C, the switching of the switch units 150 and 151 to the fixed contacts $g_5$ and $g_7$ is achieved at a timing $t_2$ after an interval A from the timing $t_1$ corresponding to the commencing of the read operational mode of the magnetic disk device 1, while the switch unit 150 undergoes a switching from the fixed contact $g_5$ to the fixed contact $g_4$ with a timing $t_3$ after an interval B from the foregoing timing $t_2$. Further, the switch unit 150 undergoes a switching from the fixed contact $g_4$ to the fixed contact $g_5$ with a timing $t_4$ after an interval C from the foregoing timing $t_3$. At the timing $t_4$, the switch unit 151 also undergoes a switching from the contact $g_7$ to the contact $g_8$.

Thus, during the interval A, the zero value is supplied to the VCO 12 as the phase-error. At the timing $t_2$, on the other hand, the phase-error value given by Eq.(1) is supplied to the VCO 12. Thereby, the phase-error which is expected to be caused after the interval B is calculated according to Eq.(1). By using the phase-error value thus calculated, the phase synchronization is achieved instantaneously for the clock signal produced by the VCO 12.

Next, at the timing $t_3$, the control signal $S_1$ causes a transition in the switch unit 150 from the contact $g_5$ to the contact $g_4$ and a zero phase error is supplied to the VCO 12 for a predetermined time interval C. In response to this, the VCO maintains its state during the interval C.

After the interval C, the control signals S1 and S2 from the controller 414 control the switch units 150 and 151 so as to cause a transition, in the movable contact $g_6$ for the case of the switch unit 150 from the contact $g_4$ to the contact $g_5$, and a transition in the movable contact $g_9$ for the case of the switch unit 151 from the contact $g_7$ to the contact $g_8$. In response to this, the actual phase error signal detected by the demodulator 405 is supplied to the VCO 12, and the VCO is controlled so as to nullify the phase error.

According to the foregoing control of the VCO 12 based on the control signals $S_1$ and $S_2$, the phase-error is instantaneously and forcedly eliminated by supplying the output phase-error value of the operational unit 16 to the VCO 12 with the timing $t_2$. Thereby, the time necessary for establishing a phase synchronization for the clock signal is dramatically reduced. After this, the VCO 12 is supplied with zero phase-error value with the timing $t_3$ and the phase synchronization of the clock signal is maintained.

In view of possible phase error that may occur after the timing $t_3$, the phase error value observed by the demodulator 405 is supplied to the VCO 12 with the timing $t_4$. Thereby, the phase synchronization of the clock signal is successfully maintained over the entire read mode duration of the magnetic disk device 1.

Hereinafter, description will be made on how to determine the intervals A, B and C with reference to the timing chart of FIGS. 8A–8C.

The interval A between the timing $t_1$ and the timing $t_2$ is determined according to the relationship:

A=(sum of the clocks in ADC 404, demodulator 405 and phase error detection unit 13)×clock cycle,  (2)

wherein it should be noted that the sum represented in Eq.(2) means the total number of the clock signals occurring in the process: of sampling the incoming analog signal in the ADC unit 404; processing the output of the ADC unit 404 in the demodulator 405; and processing the output of the demodulator 405 in the phase-error detection unit 13, and is obtained by the counter 413 of FIG. 5.

The interval B between the timing $t_2$ and the timing $t_3$, on the other hand, is determined by the duration given by Eq.(1) when conducting the phase-error cancellation in a single clock cycle. In this case, the interval B is equivalent to one clock cycle. Alternatively, the phase-error cancellation may be carried out over a multiple clock cycles. In the event the phase-error cancellation is to be achieved over an interval of X clock cycles, the interval B becomes equivalent to the interval of the X clock cycles, and the operational unit 16 provides a phase-error value of 1/X times the phase error value given by Eq.(1).

Further, the interval between the timing $t_3$ and the timing $t_4$ is obtained according to the relationship C=(sum of the clocks in the ADC unit 404, demodulator 405 and the phase error detection unit 13)×clock cycle, (3)

wherein it can be seen that Eq.(3) is identical with Eq.(2) noted above for the interval A.

After the interval C, the clock signal is phase-locked as indicated in FIGS. 8A–8C by the timing $t_4$.

FIGS. 9A–9D show an example of the clock phase synchronization process according to the present invention.

In the drawings, FIG. 9A shows the waveform of the incoming phase synchronization signal supplied to the ADC unit 404 while FIG. 9B shows the ideally phase-synchronized clock signal. Further, FIG. 9C shows the clock signal actually supplied to the ACD unit 404 from the VCO 12 and FIG. 9D shows the timing of the switching conducted by the switch 15 of FIG. 7.

Referring to the drawings, the VCO 12 is driven with zero phase-error at the beginning of the phase synchronizing process, and the demodulator 405 detects the phase-error of the clock signal of FIG. 9C during the interval starting from the timing $t_1$. During this interval, an initial phase-error value $\theta_A$ is obtained from a first clock signal of a first clock cycle and a next phase-error value $\theta_A'$ is obtained from a next clock signal of the next clock cycle. In response to the phase-error values $\theta_A$ and $\theta_A'$ thus obtained and fed back to the phase-synchronizing circuit 412, the phase-error detection unit 13 in the phase-synchronizing circuit 412 calculates the phase-error increment (or decrement) $(\theta_A-\theta_A')$ for one clock cycle. Further, the length of the interval A, and hence the timing $t_2$, is calculated in the control unit 414 according to the relationship of Eq.(2), while using the output of the counter 413 counting the number of clocks needed for the incoming analog signal is sampled in the ADC unit 404, the phase-error detection is made in the demodulator 405 based on the output of the ADC unit 404, and for the processing in the phase detection unit 13 for calculating the foregoing phase-error increment.

Thus, at the timing $t_2$ thus determined, the control unit 414 supplies the control signals $S_1$ and $S_2$, and the movable contact $g_6$ of the switch unit 150 is switched to the fixed contact $g_5$, and the movable contact $g_9$ of the switch unit 151 is switched to the fixed contact $g_7$.

Thus, the operational unit 16 of the phase synchronizing circuit 412 is connected to the VCO 12, and the VCO 12 is controlled by the phase-error value $\theta_{AM}$ calculated in the operational unit 16 during the interval B corresponding to one clock cycle of Eq.(1). At the end of the interval B, the switch unit 150 is switched to the contact $g_4$ in corresponding to the timing $t_3$.

As a result of the process during the interval B, it should be noted that the phase-error of the clock signal produced by the VCO 12 is substantially nullified or compensated. Thus, during the interval C starting with the timing $t_3$, the switch unit 150 of the switch 15 is switched to the fixed contact $g_4$ and the VCO 12 is caused to run without a phase-error input.

Further, the duration of the interval C is obtained according to the relationship of Eq.(3) and the switch units 150 and 151 are switched respectively to the fixed contact $g_5$ and to the fixed contact $g_8$, and the supply of the actual phase-error value detected by the demodulator 405 to the VCO 12 is started. Thereby, the clock signal is phase-locked.

According to the present invention as explained above, the phase error is calculated at the beginning of the phase synchronizing process and a phase-error nullifying process is conducted by using the phase-error value thus obtained. Thereby, the time needed for the phase synchronizing circuit to converge to the phase synchronized state is reduced substantially. When the initial phase-error is thus nullified or compensated, the VCO 12 producing the clock signal is controlled by the actually detected phase-error value, and the desired phase lock is achieved for the clock signal.

By using the phase-synchronized clock signal thus obtained, the demodulator 405 demodulates the information signal reproduced from the magnetic disk 2 by the magnetic head 5.

Further, it should be noted that the phase synchronizing process explained in the present invention is by no means limited to the use in a magnetic disk device but is applicable to general phase synchronizing circuit.

In the construction noted above, it should be noted that the switch 15 is by no means limited to a mechanical switch, with is merely used for the clarity of explanation, but other various switches including an electronic switch circuit, may also be used.

Further, the present invention is by no means limited to the embodiments described heretofore, but various variations and modifications may be made without departing from the scope of the invention.

What is claimed is:

1. A phase-synchronizing circuit, comprising:
   a clock generator generating a clock signal;
   a phase-error detection circuit detecting a first phase-error of said clock signal based on an output signal formed in response to said clock signal;
   a phase control circuit controlling the phase of said clock signal in response to a phase-error supplied thereto;
   a phase-error value creation circuit creating a second phase-error value, said second phase-error value being determined so as to minimize a time needed for establishing a phase synchronization of said clock signal; and
   a selection circuit selectively supplying said first phase-error value or said second phase-error value to said phase control circuit as an output signal representing said phase-error,
   said phase control circuit thereby adjusting a phase of said clock signal in response to said output signal of said selection circuit,
   wherein said selection circuit selectively supplied a fixed phase-error value to said phase control circuit during a first interval,
   said selection circuit further supplying second phase-error value to said phase control circuit during a second interval after said first interval,
   said selection circuit further supplying said fixed phase error value selectively to said phase-control circuit during a third interval after said second interval, and said selection circuit further supplying said first phase-error value to said phase control circuit during a fourth interval after said third interval.

2. A phase-synchronizing circuit as claim in claim 1, wherein said second phase-error value is determined based on a variation of said phase-error observed for said clock signal by said phase-error detection circuit.

3. A phase synchronizing method of a clock signal, comprising the steps of:

detecting a first phase-error value indicative of a phase-error of a clock signal based on an output signal formed in response to said clock signal;

creating a second phase-error value so as to minimize a time needed for establishing a phase synchronization of said clock signal based on said first phase-error value;

selecting one of said first and second phase-error values as a selected phase-error value; and adjusting a phase of said clock signal in response to said selected phase-error value, wherein said step of selecting one of said first phase-error value and said second phase-error value;

selecting a fixed phase-error value during a first interval, selecting said second phase-error value during a second interval after said first interval, selecting said fixed phase-error value during a third interval after said second interval; and selecting said first phase-error value during a fourth interval after said third interval.

4. A method as claimed in claim 3, wherein said step of creating said second phase error value obtains said second phase error value based on a variation of said phase-error between a first clock signal cycle and a second clock signal cycle.

5. A storage device, comprising:

a storage medium storing information on a recording surface thereof;

a read/write head scanning over said recording surface of said storage medium;

a signal processing circuit connected to said read/write head for processing an analog output signal of said read/write head, said signal processing circuit comprising:

a clock generator generating a clock signal;

a phase-error detection circuit detecting a first phase-error of said clock signal based on an output signal formed in response to said clock signal;

a phase control circuit controlling the phase of said clock signal in response to a phase-error supplied thereto;

a phase-error value creation circuit creating a second phase-error value, said second phase-error value being determined so as to minimize a time needed for establishing a phase synchronization of said clock signal; and a selection circuit selectively supplying one of said first phase-error value and said second phase-error value to said phase control circuit as an output signal representing said phase-error, said phase control circuit thereby adjusting a phase of said clock signal in response to said output signal of said selection circuit.

6. A storage device as claimed in claim 5, wherein said second phase-error value is determined based on a variation of said phase-error observed for said clock signal by said phase-error detection circuit.

7. A storage device as claimed in claim 5, wherein said selection circuit selectively supplies a fixed phase-error value to said phase control circuit during a first interval, said selection circuit further supplying second phase-error value to said phase control circuit during a second interval after said first interval, said selection circuit further supplying said fixed phase error value selectively to said phase-control circuit during a third interval after said second interval, said selection circuit further supplying said first phase-error value to said phase control circuit during a fourth interval after said third interval.

* * * * *